United States Patent
Spesser

(10) Patent No.: US 10,912,236 B2
(45) Date of Patent: Feb. 2, 2021

(54) MONITORING APPARATUS FOR A COOLING APPARATUS

(71) Applicant: Dr. Ing. h.c. F. Porsche Aktiengesellschaft, Stuttgart (DE)

(72) Inventor: Daniel Spesser, Illingen (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 247 days.

(21) Appl. No.: 16/249,005

(22) Filed: Jan. 16, 2019

(65) Prior Publication Data

US 2019/0223331 A1 Jul. 18, 2019

(30) Foreign Application Priority Data

Jan. 17, 2018 (DE) .......................... 10 2018 100 992

(51) Int. Cl.
*H02H 5/00* (2006.01)
*H05K 7/20* (2006.01)
(Continued)

(52) U.S. Cl.
CPC ....... *H05K 7/20945* (2013.01); *H02H 1/0007* (2013.01); *H02H 7/1203* (2013.01);
(Continued)

(58) Field of Classification Search
None
See application file for complete search history.

(56) References Cited

U.S. PATENT DOCUMENTS

| 5,215,044 A | 6/1993 | Banzhaf et al. |
| 5,904,202 A * | 5/1999 | Adamy .................. B22D 11/16 164/151.4 |

(Continued)

FOREIGN PATENT DOCUMENTS

| DE | 102011076908 A1 | 12/2012 |
| EP | 2494162 A1 | 8/2013 |

(Continued)

OTHER PUBLICATIONS

Chinese Office Action for Chinese Application No. 2019100357789, dated Sep. 11, 2020, 9 pages.

(Continued)

*Primary Examiner* — Stephen W Jackson
(74) *Attorney, Agent, or Firm* — RatnerPrestia

(57) ABSTRACT

A monitoring apparatus has a control apparatus for monitoring a cooling apparatus for a power electronics arrangement. The control apparatus has an input and an output, which input is configured to receive a temperature signal from a temperature sensor, and to determine a temperature value depending on the temperature signal, and which output is configured to output an output signal. The control apparatus performs the following steps: ascertaining at least twice a temperature value and a time value assigned to the temperature value, ascertaining a difference quotient of the change in the temperature values to the change in the assigned time values, determining the state of the cooling apparatus of the power electronics arrangement depending on the ascertained difference quotient, outputting the output signal depending on the state in order to influence the power electronics arrangement.

16 Claims, 8 Drawing Sheets

(51) Int. Cl.
*H02H 1/00* (2006.01)
*H02H 7/12* (2006.01)
*G07C 5/08* (2006.01)

(52) U.S. Cl.
CPC ..... *H05K 7/20872* (2013.01); *H05K 7/20927* (2013.01); *G07C 5/0808* (2013.01)

(56) References Cited

U.S. PATENT DOCUMENTS

| | | | | |
|---|---|---|---|---|
| 6,966,652 | B1* | 11/2005 | Lai | G03B 21/16 |
| | | | | 353/52 |
| 7,922,388 | B2* | 4/2011 | Gerder | G01K 1/16 |
| | | | | 374/164 |
| 9,190,834 | B2 | 11/2015 | Casares | |
| 10,719,091 | B2* | 7/2020 | Johnson | G05B 15/02 |
| 2010/0111134 | A1 | 5/2010 | Matsumoto | |
| 2012/0199084 | A1 | 8/2012 | Kinomura | |
| 2012/0262881 | A1 | 10/2012 | Onimaru et al. | |
| 2013/0069591 | A1 | 3/2013 | Iyasu et al. | |

FOREIGN PATENT DOCUMENTS

| | | |
|---|---|---|
| JP | 2010136609 A | 6/2010 |
| JP | 2015130769 A | 7/2015 |
| JP | 2015136217 A | 7/2015 |

OTHER PUBLICATIONS

Korean Office Action for Korean Application No. 10-2019-0004591, dated Jan. 10, 2020, 4 pages.
Electric Car—Wikipedia, https://en.wikipedia.org/wiki/Electric_car, downloaded Jan. 14, 2019—12 pages.
Notification of Reason for Rejection for Japanese Application No. 2019-005661, dated Jan. 7, 2020, 2 pages.

\* cited by examiner

MONITORING APPARATUS FOR A COOLING APPARATUS

CROSS-REFERENCE TO RELATED APPLICATION

This application claims priority to German Patent Application No. DE 10 2018 100 992.5, filed Jan. 17, 2018, which is incorporated by reference herein in entirety.

FIELD OF THE INVENTION

The invention relates to a monitoring apparatus for a cooling apparatus. The cooling apparatus is, in particular, for a power electronics arrangement.

BACKGROUND OF THE INVENTION

Power electronics arrangements such as DC/DC converters and AC/DC converters convert a voltage to a different voltage and serve, for example, to charge an electrical high-voltage battery or to convert between the high-voltage network of a vehicle and the low voltage on-board power supply system. Power electronics arrangements of this kind sometimes operate with a power of 11 kW or 22 kW, for example, and in the process heat losses are produced, which have to be dissipated by means of a cooling apparatus. In the case of large powers, the cooling is necessary using a coolant, in particular a liquid. The automotive industry is developing solutions for highly automated driving and in so doing the demands on the reliability of the electronics components are increasing. Standards such as ASIL D (Automotive Safety Integrity Level D) provide strict standards, for example the requirement of a redundant design of a separate development for a component to increase safety. In the context of this discussion, it is envisaged to provide a redundant design of the on-board power supply system battery for the low-voltage range (for example 12 V or 24 V) in order that, in the event of failure of an on-board power supply system battery, the driver continues to have a functioning steering system and can head toward a rest stop, for example. The provision of two on-board power supply system batteries led to a high weight and the redundancy could also be achieved by way of a DC/DC converter, which generates the required low voltage from a high-voltage battery for the drive. To this end, however, sufficient cooling is required in order to be able to provide a sufficient rated power. For implementation, it is advantageous if it is possible to detect reliably whether the cooling apparatus is operating correctly.

US 2012/0199084 A1, U.S. Pat. No. 5,215,044 A and EP 2 494 162 B1, all of which are incorporated by reference herein, show a cooling system having a plurality of temperature sensors for a vehicle having an internal combustion engine or a hybrid drive.

US 2012/0262881 A1, which is incorporated by reference herein, shows a method in which a check is carried out to determine whether a sufficient amount of coolant is present in the liquid phase. When this is the case, a compressor and a cooling fan are switched off.

US 2013/0069591 A1, which is incorporated by reference herein, shows a method for controlling a cooling system for a vehicle charging device depending on a plurality of temperature sensors.

SUMMARY OF THE INVENTION

A monitoring apparatus for monitoring a cooling apparatus for a power electronics arrangement has a control apparatus, which control apparatus has an input and an output, which input is configured to receive a temperature signal from a temperature sensor and to determine a temperature value depending on the temperature signal, which output is configured to output an output signal, and which control apparatus is designed to perform the following steps:
  a temperature value and a time value assigned to the temperature value ascertained at least twice,
  a difference quotient of the change in the temperature values to the change in the assigned time values is ascertained,
  the state of the cooling apparatus of the power electronics arrangement is determined depending on the ascertained difference quotient and the output signal is output depending on the state in order to influence the power electronics arrangement.

Characterization of the state of the cooling apparatus depending on the difference quotient has proven to be very significant and permits comparatively precise determination of the state.

According to a preferred embodiment, the monitoring apparatus determines whether the temperature is located in a rising region or in an asymptotic region based on the time profile of the temperature values, and the monitoring apparatus is designed, during the transition from the rising region to the asymptotic region, to store the associated temperature value and the associated value and to use said values in the formation of the difference quotient.

As a result of this, measurement occurs at a prescribed point of the temperature curve, and this leads to difference quotients that can be compared easily.

According to a preferred embodiment, the monitoring apparatus is designed to ascertain the transition from the rising region to the asymptotic region in that the difference quotient is lower than a prescribed minimum difference quotient. This is a simple and effectively functioning embodiment that places only low demands on the hardware.

According to a preferred embodiment, the monitoring apparatus is designed to ascertain the transition from the rising region to the asymptotic region in that, during the time profile, the maximum difference quotient is ascertained and the transition is assumed when the difference quotient is lower than a prescribed proportion of the maximum difference quotient. In the case of output and ambient conditions that change very significantly, this increases the precision of the determination of the transition.

According to a preferred embodiment, the monitoring apparatus is designed, upon activation of the power electronics arrangement, to store the associated temperature value and the associated time value and to use said values in the formation of the difference quotient. As a result of this, measurement occurs at an early point of the temperature curve, and this leads to a good estimation of the overall gradient.

According to a preferred embodiment, the monitoring apparatus is designed to determine a time at which the temperature value exceeds a prescribed first temperature limit value, and the monitoring apparatus is designed to store the associated temperature value or the first temperature limit value on the one hand and the associated time value on the other hand and to use said values in the formation of the difference quotient. As a result of this, measurement occurs at a prescribed point of the temperature curve, and this leads to difference quotients that can be compared easily.

According to a preferred embodiment, the monitoring apparatus is designed to determine and to evaluate repeatedly the difference quotient of temporally spaced temperature measurement values. In the case of repeated determination of the present difference quotient, it is possible to react to extreme changes in a timely manner.

According to a preferred embodiment, the monitoring apparatus has a first prescribed difference quotient, which characterizes a first fault state of the cooling apparatus, and which uses the criterion that the ascertained difference quotient is greater than the first prescribed difference quotient as a condition for the assumption of the first fault state of the cooling apparatus. It has been shown that, when the difference quotient is too great, it is possible to assume a fault state with a high degree of likelihood. In particular, in the case of a leak of a coolant, there is a critical rapid rise in the temperature.

According to a preferred embodiment, the monitoring apparatus uses the criterion that the present temperature value is greater than a prescribed second temperature limit value as an additional condition for the assumption of the first fault state. As a result of this, the absolute temperature can also be taken into account.

According to a preferred embodiment, the monitoring apparatus is designed, upon identification of the first fault state of the cooling apparatus, to output an interruption signal by means of the output in order to deactivate the power electronics arrangement. The power electronics arrangement can be protected against damage through deactivation.

According to a preferred embodiment, the monitoring apparatus has a second prescribed difference quotient, which characterizes a second fault state of the cooling apparatus, and which uses the criterion that the ascertained difference quotient is greater than the second prescribed difference quotient as a condition for the assumption of the second fault state of the cooling apparatus. By using the second prescribed difference quotient, it is also possible to identify less severe fault states and to react to them accordingly. The second prescribed difference quotient is preferably lower than the first prescribed difference quotient.

According to a preferred embodiment, the monitoring apparatus uses the criterion that the ascertained difference quotient is lower than the first prescribed difference quotient as an additional condition for the assumption of the second fault state of the cooling apparatus. As a result of this, lower fault states can be differentiated easily from greater fault states.

According to a preferred embodiment, the monitoring apparatus uses the criterion that the present temperature value is greater than a prescribed third temperature limit value as an additional condition for the assumption of the second fault state. As a result of this, further fault states can also be identified.

According to a preferred embodiment, the monitoring apparatus is designed, upon identification of the second fault state of the cooling, apparatus, to output a reduction signal by means of the output in order to reduce the maximum power of the power electronics arrangement. The power electronics arrangement can still function, for example in emergency operation.

According to a preferred embodiment, the power electronics arrangement is an AC/DC converter, a DC/AC converter or a DC/DC converter. In the case of said converters, the monitoring apparatus is particularly advantageous since they enable redundancy, for example with respect, to a vehicle battery in the on-board power supply system, and consequently increase safety.

According to a preferred embodiment, at least some of the ascertained difference quotients are stored, for example extreme difference quotients or difference, quotients above a prescribed limit value.

According to a preferred embodiment, a vehicle has a monitoring apparatus of this kind. The monitoring apparatus significantly increases safety.

BRIEF DESCRIPTION OF THE DRAWINGS

Further details and advantageous refinements of the invention emerge from the exemplary embodiments described below and illustrated in the drawing, which embodiments should in no way be understood as restricting the invention, and also from the dependent claims. In the drawing:

DETAILED DESCRIPTION OF THE INVENTION

Figure 1:
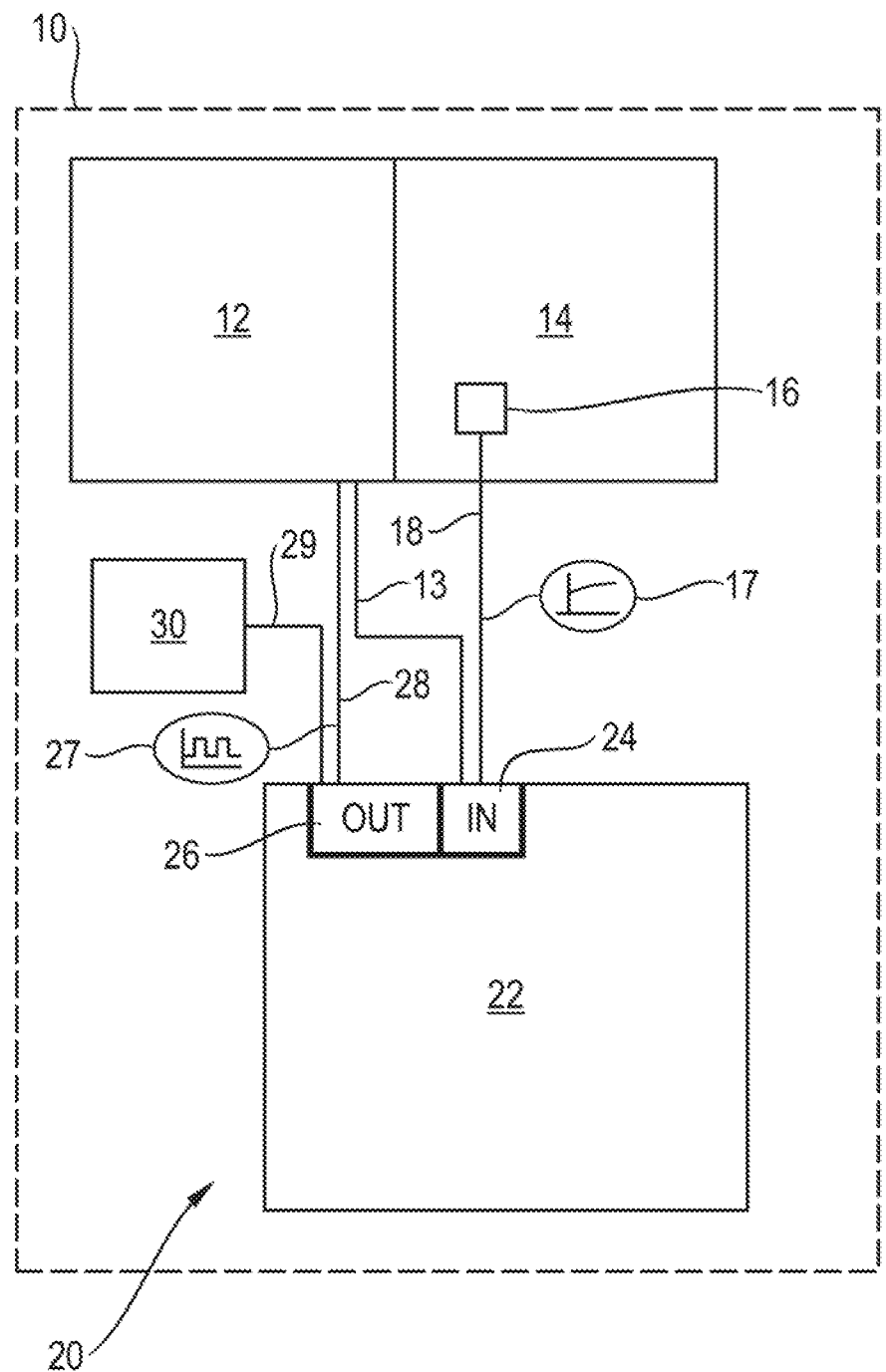
FIG. 1 shows a schematic illustration of the overall design of a vehicle having a power electronics arrangement, a cooling apparatus and a monitoring apparatus.

FIG. 1 shows a schematic illustration of a vehicle 10, for example an electric vehicle or a hybrid vehicle. A power electronics arrangement 12 is provided, in particular a DC/DC converter, a DC/AC converter or an AC/DC converter. A cooling apparatus 14 for cooling the power electronics arrangement 12 is provided and a temperature sensor 16 is provided on the cooling apparatus 14 in order to generate a temperature signal 17 depending on a temperature at the cooling apparatus 14 and to output said temperature signal via a data line 18. A monitoring apparatus 20 has a control apparatus 22 having an input IN 24 and an output OUT 26. The power electronics arrangement 12 is connected to the input 24 by means of a data line 13 and the data line 18 is likewise connected to the input 24. The output 26 is connected to the power electronics arrangement 12 by means of a data line 28 for the purpose of transmitting a signal 27. The output 26 is also connected to a vehicle computer 30 by means of a data line 29 in order to make it possible to output a fault.

The control apparatus 22 is designed to evaluate the temperature signal 17 and make it possible to influence the power electronics arrangement 12 depending on said temperature signal. In addition or as an alternative, a fault signal can be output to the vehicle computer 30. The control apparatus 22 identifies here whether the cooling apparatus 14 is operating normally or whether there is a fault. In the case of liquid cooling, for example, the coolant can disappear from the cooling circuit due to a leak or the coolant is not delivered since a coolant line is blocked or the pump is not functioning, for example.

Figure 2:
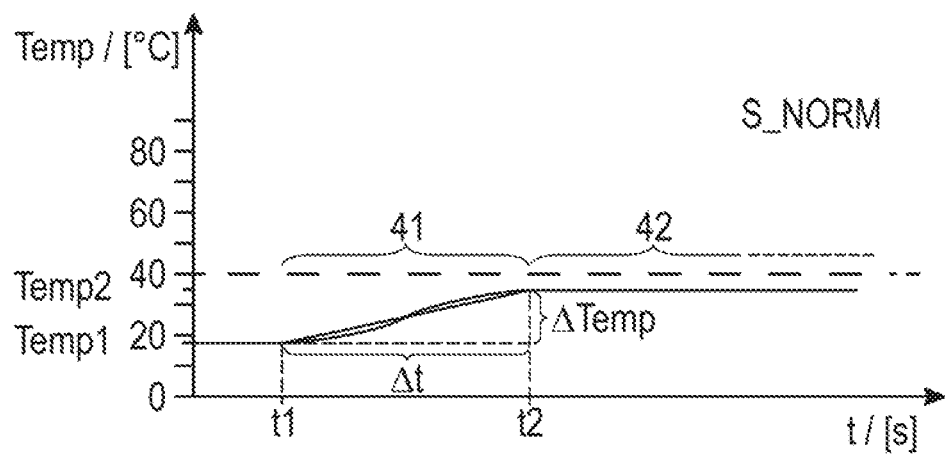
FIG. 2 shows a temperature profile of a coolant in the case of a correctly operating cooling apparatus.

FIG. 2 shows the temperature measured by means of the temperature sensor 16 plotted over time. The power electronics arrangement 12 is activated at the time t1 and, as a result of the power loss of the power electronics arrangement 12, the temperature of the coolant of the cooling device 14 rises. A corresponding temperature results gradually depending on the power loss of the power electronics arrangement 12. After the activation of the power electronics arrangement 12, the temperature profile has a rising region 41, in which the temperature rises, and an asymptotic region 42, in which the temperature only changes a little, follows the rising region 41. The cooling apparatus 14 is located in a normal state S_Norm, that is to say it functions in a fault-free manner.

A time t1, at which the power electronics arrangement 12 has been activated, is indicated. The transition from the rising region 41 to the asymptotic region 42 takes place at time t2. The temperature has a temperature value Temp1 at time t1 and a temperature value Temp2 at time t2. As well as the profile of the temperature, the direct gradient between the values at times t1 and t2 is also indicated. The gradient can be calculated from the difference quotients DQ of the temperature values and of the time values according to the formula $$DQ=\Delta \text{Temp}/\Delta t=(\text{Temp2}-\text{Temp1})/(t2-t1) \quad (1)$$

Figure 3:
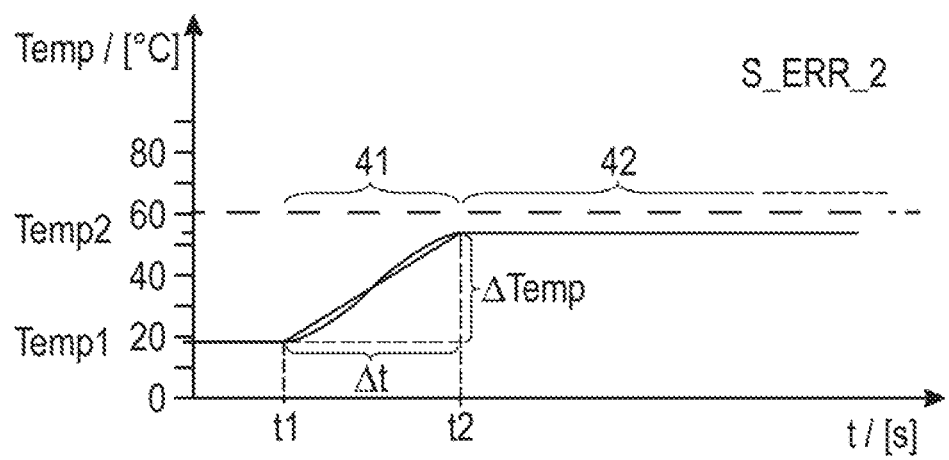
FIG. 3 shows the temperature profile of the coolant in a first fault state of the cooling apparatus.

FIG. 3 shows the profile of the temperature in a state S_ERR_2, in which coolant does not flow since the coolant pump is faulty, for example.

The power electronics arrangement 12 is activated again at time t1 and a transition from the rising region 41 to the asymptotic region 42 takes place at time t2. It can be seen that the profile is steeper than in FIG. 2 and a higher temperature Temp2 is achieved at time t2. The difference quotient is accordingly greater than in FIG. 2.

Figure 4:
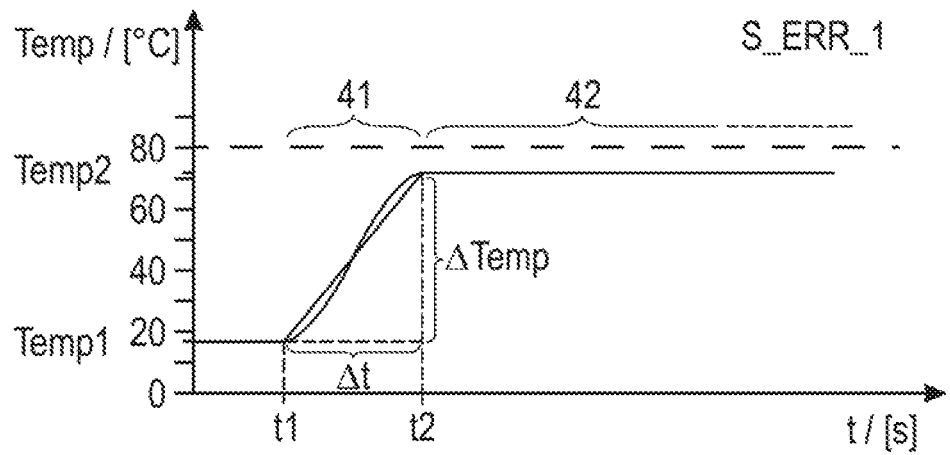
FIG. 4 shows the temperature profile of the coolant in a second fault state of the cooling apparatus.

FIG. 4 shows the profile of the temperature for a state S_ERR_1, in which the cooling apparatus 14 has lost coolant and, as a result of this, the cooling is significantly impaired. The power electronics arrangement 12 is activated at time t1 and a transition from the rising region 41 to the asymptotic region 42 takes place at time t2. The gradient between times t1 and t2 is even steeper than in FIG. 3 and FIG. 2 and consequently the difference quotient DQ is also greater in FIG. 4 than in FIG. 3 and FIG. 2.

Tests have shown that it is possible, by means of the ascertainment of the difference quotient DQ, to determine easily the state in which the cooling apparatus 14 is located.

Figure 5:
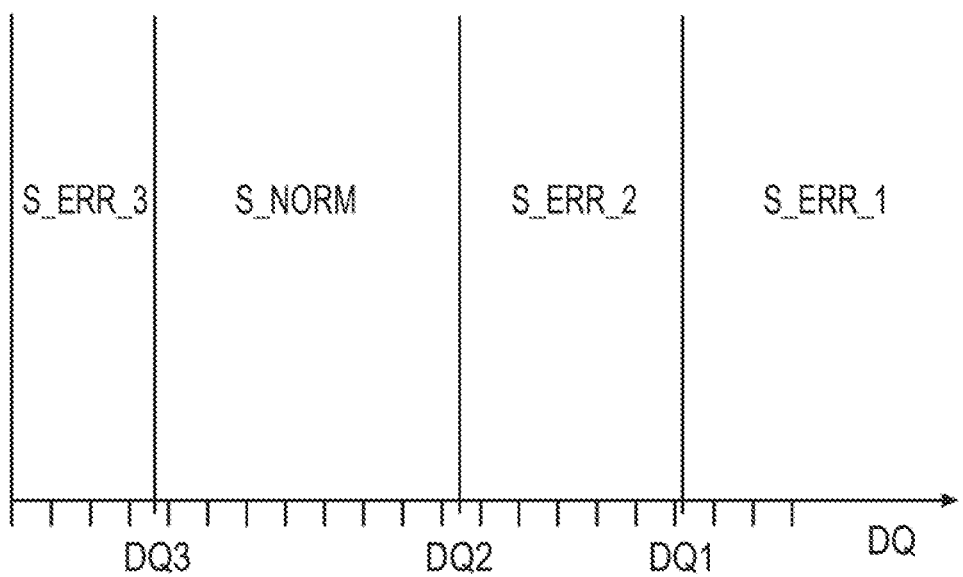
FIG. 5 shows an assignment of difference quotients to states.

FIG. 5 shows an assignment of the difference quotient DQ to different states of the cooling apparatus 10. Above a first prescribed difference quotient DQ1 and consequently in the case of a very large gradient of the temperature profile, it is assumed that the cooling apparatus 14 is in a state S_ERR_1, in which there is a serious fault, for example a loss of coolant. Between the first prescribed difference quotient DQ1 and a second prescribed difference quotient DQ2 and consequently in the case of a lower but still increased gradient, it is assumed that a state S_ERR_2 prevails, in which the cooling apparatus 14 does indeed have a certain cooling capacity but not the full cooling capacity. This can be the case, for example, when the coolant pump is not functioning. When the difference quotient DQ is lower than the prescribed second difference quotient DQ2, it is possible to assume either that the cooling apparatus 14 is functioning normally and has a state S_NORM. As an alternative, an additional third prescribed difference quotient DQ3 can be provided and it can be assumed that, when the difference quotient DQ is lower than the third difference quotient DQ3, something is not right with the cooling apparatus 14 or else with the temperature sensor.

The state ascertained in this way can be output to the power electronics arrangement 12 and/or to the vehicle computer 30 and these can react accordingly. The power electronics arrangement 12 can perform deactivation, for example, in the state S_ERR_1, since damage to the power electronics arrangement 12 can arise without cooling. In the state S_ERR_2 and S_ERR_3, the power electronics arrangement 12 can react, for example, in that the maximum power of the power electronics arrangement 12 is reduced. When the power electronics arrangement 12 is, for example, a DC/DC converter, the maximum power at the output can be decreased from 10 kW to 4 kW, for example. In the state S_ERR_3, the vehicle computer 30 can react, for example, by virtue of it prompting a search for a workshop.

The parameters DQ1, DQ2 and DQ3 and also the other parameters used in the calculations are dependent on the respective cooling apparatus and on the power electronics arrangement. For new series, for example, test measurements can be performed with the corresponding faults and correspondingly suitable parameters can be determined. Said parameters can be stored in the monitoring apparatus 20, for example, for the corresponding case of use, in a non-volatile memory.

Figure 6:
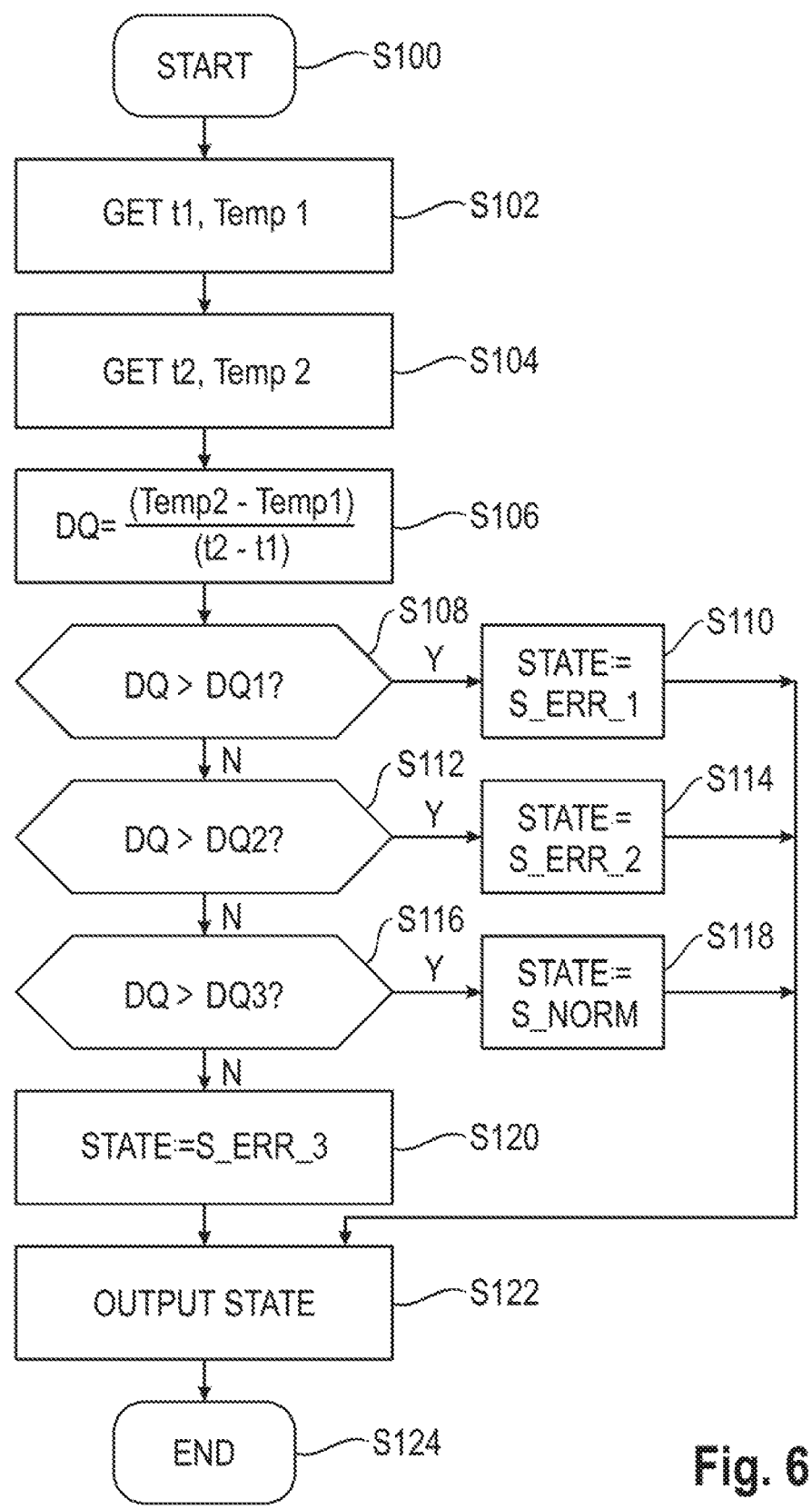
FIG. 6 shows a flowchart for the ascertainment of the state of the cooling apparatus.

FIG. 6 shows a flowchart for a routine for evaluating the difference quotient DQ. S100 is the start, for example upon activation of the power electronics arrangement 12. In S102, a first time value t1 and a first temperature value Temp1 are ascertained. Then, in S104, a second time value t2 and a second temperature value Temp2 are ascertained. In S106, the difference quotient DQ is calculated on the basis of formula (1).

In S108, a check is carried out to determine whether the difference quotient DQ is greater than the first prescribed difference quotient DQ1. If yes, the state STATE is set to the value S_ERR_1 in S110. If no, there is a jump to S112 and a check is carried out here to determine whether the difference quotient DQ is greater than the prescribed second difference quotient DQ2. If yes, the state STATE is set to the value S_ERR_2 in S114. If no, there is a jump to S116 and a check is carried out to determine whether the difference quotient DQ is greater than the prescribed third difference quotient DQ3. If yes, the state STATE is set to the value S_NORM in S118. If no, there is a jump to S120 and the state STATE is set to the value S_ERR_3. There is then a jump to S122, just like from S110, S114 and S118. In S122, the state STATE is output, for example to the vehicle computer 30 or to the power electronics arrangement 12. The routine is terminated in S124.

The routine S100 can of course also be executed repeatedly by virtue of steps S102 and S104 and consequently measurements being carried out continuously and the present difference quotients DQ subsequently being evaluated in the following steps. If the ascertainment of the difference quotient DQ is also carried out in the asymptotic region, the check in S116 can be replaced by step SUB and steps S116, S120 are removed in order that a fault state S_ERR_3 is not generated in the asymptotic region 42.

Figure 7:
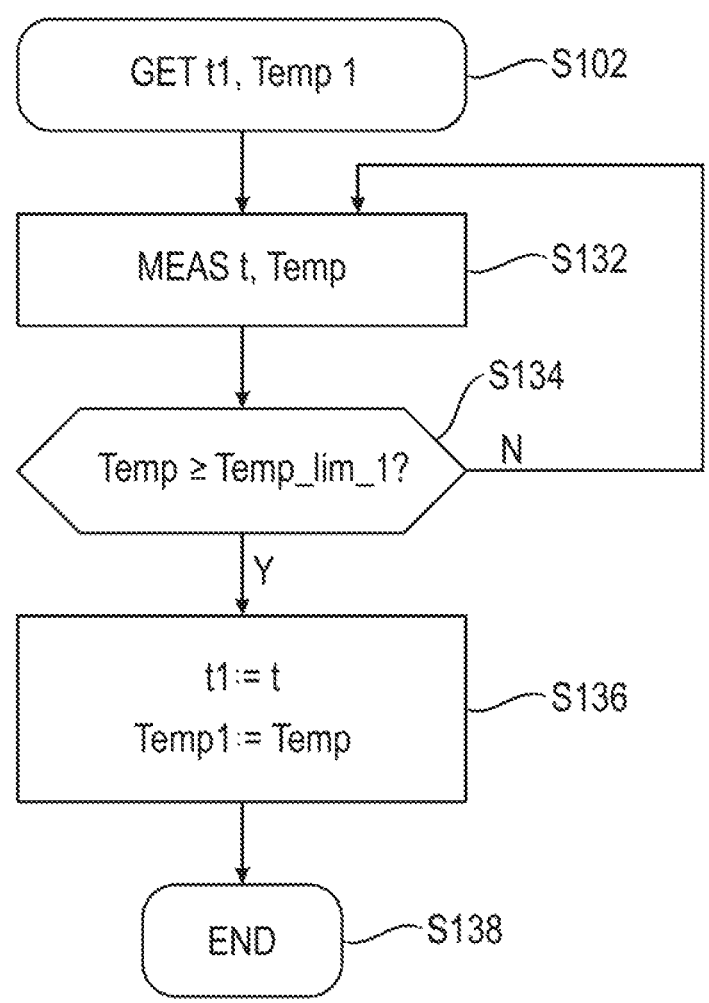
FIG. 7 shows a flowchart for the ascertainment of first time value and first temperature value.

FIG. 7 shows a possible exemplary embodiment for the routine GET t1, Temp1 S102. In S132, a present time value t and a present temperature value Temp are ascertained or measured ("MEAS"). In S134, a check is carried out to determine whether the temperature value Temp is greater than or equal to a temperature limit value Temp_lim_1, that is to say whether a determined temperature has already been reached. If no, there is a jump back to S132 and the temperature is ascertained again. If yes, there jump to S136 and the variable t1 is set to the time value t and the variable temp1 is set to the temperature value Temp. The routine is then terminated in S138. The temperature limit value Temp_lim_1 can be set, for example, to 30° C. and the calculation of the difference quotient DQ can thus be calculated at a point at which the same temperature always prevails. This makes it possible to compare the evaluation easily.

Figure 8:
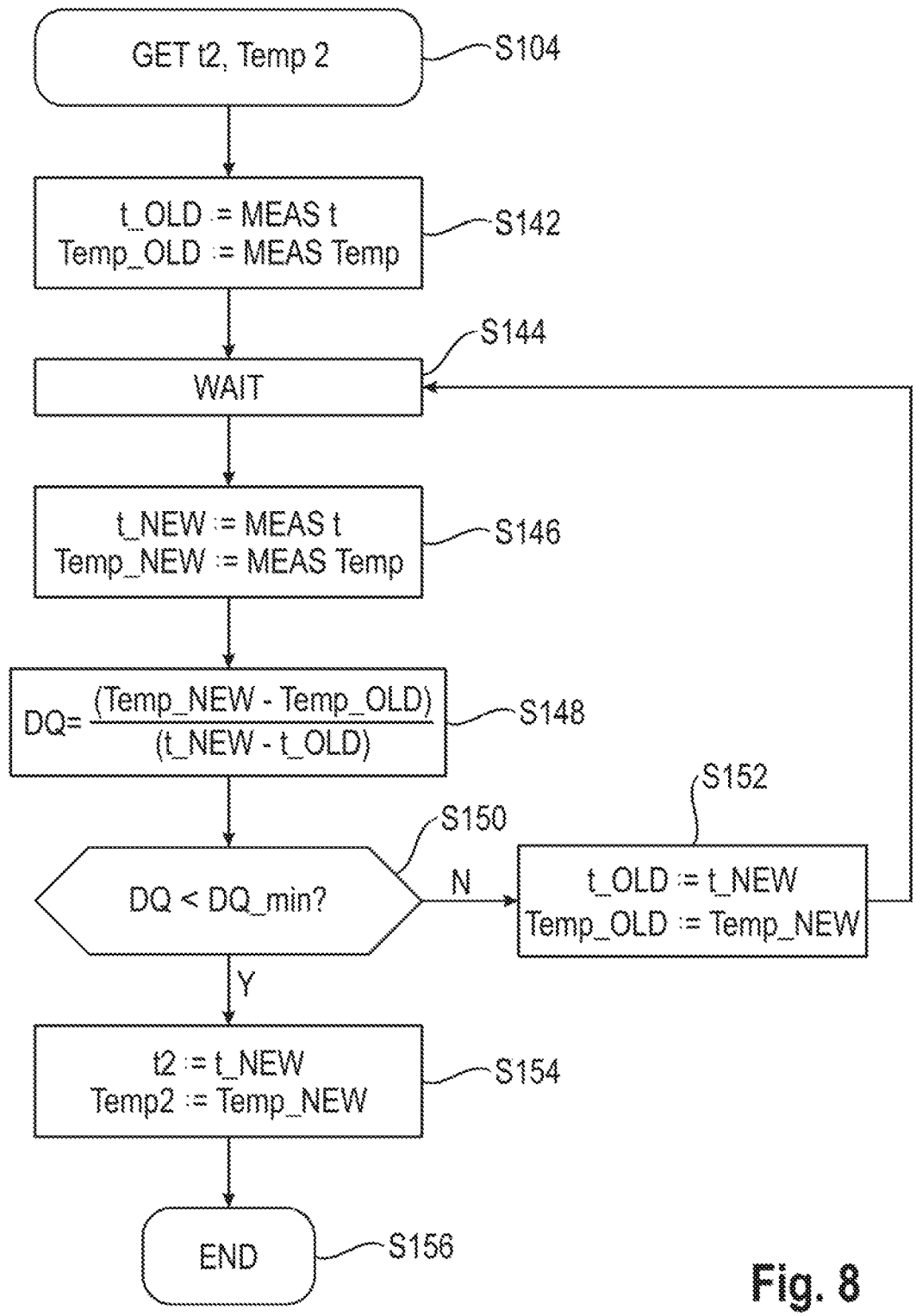
FIG. 8 shows a flowchart for the ascertainment of a second time value and second temperature value.

FIG. 8 shows an exemplary embodiment for the routine GET t2, Temp2 S104 from FIG. 6. In S142, a time value t and a temperature value Temp are measured and the ascertained values are stored in the variables t_OLD and Temp_OLD. In S144, there is a wait and, in S146, a time value and a temperature value are stored in the same way in the variables t_NEW and Temp_NEW. In S148, the difference quotient DQ is calculated and, in S159, a check is carried out to determine whether the difference quotient DQ is lower than a limit value DQ_min. If this is not the case, that is to say the gradient of the temperature profile is still relatively large, there is a jump to S152, the variable t_OLD is set to the value of the variables t_NEW, the variable Temp_OLD is set to the value of the variables Temp_NEW, and there is a jump back to S144 in order to ascertain the next difference quotient. However, if in S150 the difference quotient DQ is lower than the limit value DQ_MIN, there is a jump to S154, and the variable t2 is set to the value t_NEW, the variable Temp2 is set to the value Temp_NEW, and there is a jump to S156 in order to terminate the routine. The check in S150 ascertains whether the asymptotic region 42 with a lower gradient has already been reached. As a result of this, the time value t2 can be ascertained in a manner corresponding to FIG. 2 to FIG. 4.

As an alternative, the transition from the rising region 41 to the asymptotic region 42 can be ascertained in that, during the time profile, the maximum difference quotient DQmax is ascertained by virtue of the previously maximum value DQmax always being stored, for example, and, when the difference quotient is greater than the previous DQmax, DQmax is replaced. The transition is assumed when the difference quotient DQ is lower than a prescribed proportion of the maximum difference quotient DQmax, for example lower than 5% of DQmax or lower than 10% of DQmax.

Figure 9:
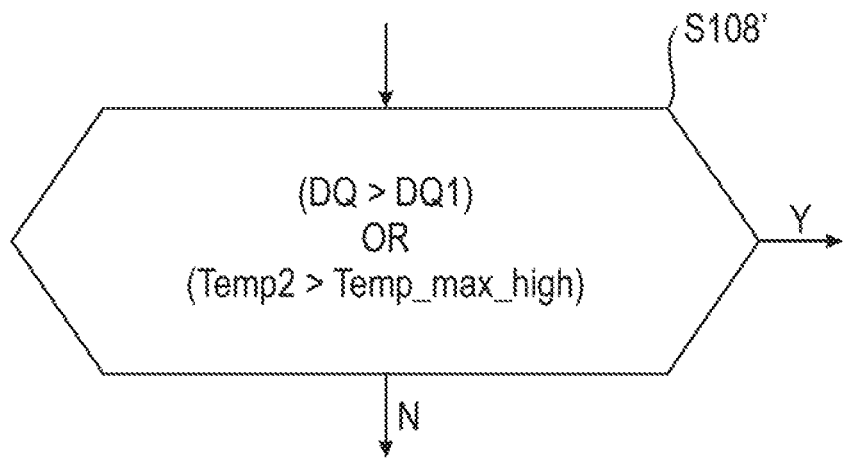
FIG. 9 shows an alternative for determination of the state of the cooling apparatus.

FIG. 9 shows an alternative embodiment for step S108 of FIG. 6. In step S108', as the fault condition for the state S_ERR_1 of the evaluation of the difference quotient DQ, there is also an evaluation to determine whether the temperature Temp2, that is to say the present temperature, is greater than a prescribed second temperature limit value Temp_max_high. That is to say that it is assumed that there is a fault when said second temperature limit value is exceeded. Depending on the case of use, the two conditions (difference quotient and maximum temperature) can also be used as necessary requirements by virtue of the OR link using the operator "OR" being replaced by an AND link using the operator "AND".

Figure 10:
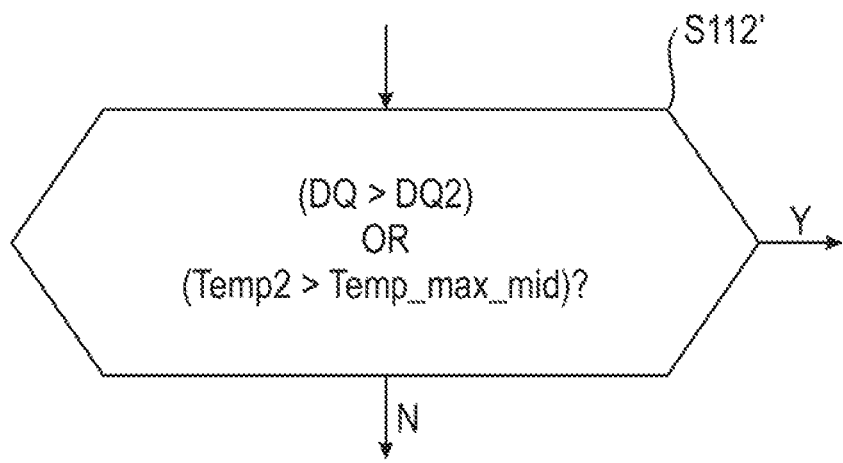
FIG. 10 shows a further alternative for determination of the state of the cooling apparatus.

FIG. 10 shows, correspondingly to FIG. 9, an alternative embodiment of step S112 of FIG. 6, in which, in addition to the evaluation of the difference quotient DQ, the fault state S_ERR_2 is also triggered when the present temperature (Temp2) is greater than a prescribed third temperature limit value Temp_max_mid. An AND link is also possible here as an alternative.

Figure 11:
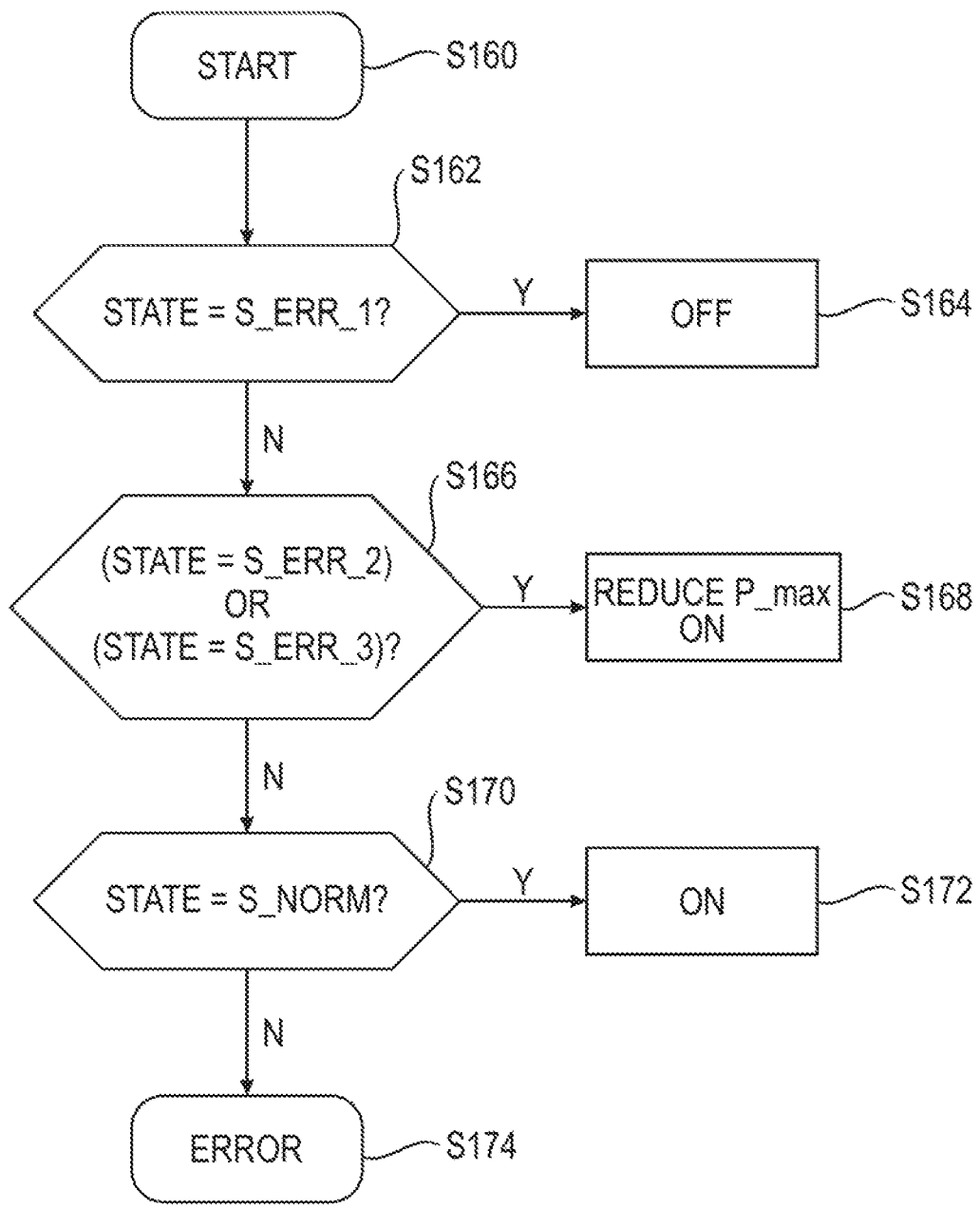
FIG. 11 shows a flowchart for the evaluation of the state by way of the power electronics arrangement.

FIG. 11 shows a schematic illustration of a reaction of the power electronics arrangement 12 to the transmitted state. The routine starts in S116 and a check is carried out in S162 to determine whether the state STATE corresponds to the state S_ERR_1. If YES, the power electronics arrangement 12 is switched off in S164. If NO, a check is carried out in S166 to determine whether the state STATE corresponds to the state S_ERR_2 or to the state S_ERR_3. If YES, in S168, the maximum power P_max is reduced but the power electronics arrangement 12 remains switched on. If NO, there is a step after S170 and a check is carried out to determine whether the state corresponds to the state S_norm. If YES, the power electronics arrangement 12 remains normally switched on ("ON"). If NO, an unknown state prevails and fault handling ("ERROR") takes place in S174.

Various variations and modifications are of course possible within the scope of the present invention.

When a comparison of "lower than" or "greater than" is mentioned, this always also includes "lower than or equal to" or "greater than or equal to", since, in the case of discrete values (for example integer values), x<y corresponds to x<=(y−1).

LIST OF REFERENCE DESIGNATIONS

10 Vehicle
12 Power electronics arrangement
14 Coding apparatus
16 Temperature sensor
17 Temperature signal
18 Data line
20 Monitoring apparatus
22 Control apparatus
24 Input
26 Output
27 Output signal
28 Data line
29 Data line
30 Vehicle computer
41 Rising region
42 Asymptotic region
Temp1, Temp2 Temperature value
t1, t2 Time
DQ Difference quotient
DQ1 Prescribed first difference quotient
DQ2 Prescribed second difference quotient
DQ_min Limit value for determination of asymptotic region
DQ_max Maximum difference quotient during measurement

What is claimed is:
1. A monitoring apparatus for monitoring a cooling apparatus for a power electronics arrangement, which monitoring apparatus has a control apparatus, which control apparatus has an input and an output, which input is configured to receive a temperature signal from a temperature sensor and to determine a temperature value (Temp1, Temp2) depending on the temperature signal, which output is configured to output an output signal, and which control apparatus is configured to perform the following steps:
   ascertain, at least twice, a temperature value (Temp1, Temp2) and a time value (t1, t2) assigned to the temperature value, ascertain a difference quotient (DQ) of a change in the temperature values (Temp1, Temp2) to a change in the assigned time values (t1, t2), determine a state (STATE) of the cooling apparatus of the power electronics arrangement depending on the ascertained difference quotient, and output (DQ) the output signal depending on the state (STATE) in order to influence the power electronics arrangement.

2. The monitoring apparatus as claimed in claim 1, which further determines whether the temperature is located in a rising region or in an asymptotic region based on a time profile of the temperature values (Temp1, Temp2), and which is configured, during the transition from the rising region to the asymptotic region, to store the temperature values (Temp1, Temp2) and the time values and to use said values in the formation of the difference quotient (DQ).

3. The monitoring apparatus as claimed in claim 2, which is further configured to ascertain the transition from the rising region to the asymptotic region in that the difference quotient (DQ) is lower than a prescribed minimum difference quotient (DQ_min).

4. The monitoring apparatus as claimed in claim 2, which is further configured to ascertain the transition from the rising region to the asymptotic region in that, during the time profile, a maximum difference quotient (DQmax) is ascertained and the transition is assumed when the difference quotient (DQ) is lower than a prescribed proportion of the maximum difference quotient (DQmax).

5. The monitoring apparatus as claimed in claim 1, which is configured, upon activation of the power electronics arrangement, to store the associated temperature value (Temp1) and the associated time value (t1) and to use said, values in the formation of the difference quotient (DQ).

6. The monitoring apparatus as claimed in claim 1, which is configured to determine a time (t1) at which the temperature value (Temp) exceeds a prescribed first temperature limit value (Temp_lim_1), and which is configured to store the associated temperature value (Temp1) or the first temperature limit value (Temp_lim_1) and the associated time value (t1) and to use said values in the formation of the difference quotient (DQ).

7. The monitoring apparatus as claimed in claim 1, which is configured to determine and to repeatedly evaluate the difference quotient (DQ) of the temporally spaced temperature measurement values (Temp1, Temp2).

8. The monitoring apparatus as claimed in claim 7, which has a first prescribed difference quotient (DQ1), which characterizes a first fault state (S_ERR_1) of the cooling apparatus, and which uses the criterion that the ascertained difference quotient (DQ) is greater than the first prescribed difference quotient (DQ1) as a condition for an assumption of the first fault state (S_ERR_1) of the cooling apparatus.

9. The monitoring apparatus as claimed in claim 8, which uses the criterion that a present temperature value (Temp) is greater than a prescribed second temperature limit value (Temp_max_high) as an additional condition for the assumption of the first fault state (S_ERR_1).

10. The monitoring apparatus as claimed in claim 8, which is configured, upon identification of the first fault state (S_ERR_1) of the cooling apparatus, to output an interruption signal by way of the output in order to deactivate the power electronics arrangement.

11. The monitoring apparatus as claimed in claim 8, which has a second prescribed difference quotient (DQ2), which characterizes a second fault state (S_ERR_2) of the cooling apparatus, and which uses the criterion that the ascertained difference quotient (DQ) is greater than the second prescribed difference quotient (DQ2) as a condition for the assumption of the second fault state (S_ERR_2) of the cooling apparatus.

12. The monitoring apparatus as claimed in claim 11, which uses the criterion that the ascertained difference quotient (DQ) is lower than the first prescribed difference quotient (DQ1) as an additional condition for the assumption of the second fault state (S_ERR_2) of the cooling apparatus.

13. The monitoring apparatus as claimed in claim 11, which uses the criterion that a present temperature value (Temp) is greater than a prescribed third temperature limit value (Temp_max_mid) as an additional condition for the assumption of the second fault state (S_ERR_2).

14. The monitoring apparatus as claimed in claim 11, which is configured, upon identification of the second fault state (S_ERR_2) of the cooling apparatus, to output a reduction signal by way of the output in order to reduce a maximum power of the power electronics arrangement.

15. The monitoring apparatus as claimed in claim 1, in which the power electronics arrangement is an AC/DC converter, a DC/AC converter or a DC/DC converter.

16. A vehicle having the monitoring apparatus as claimed in claim 1.

* * * * *